United States Patent [19]

Kimura

[11] Patent Number: 5,172,358

[45] Date of Patent: Dec. 15, 1992

[54] LOUDNESS CONTROL CIRCUIT FOR AN AUDIO DEVICE

[75] Inventor: Shigenobu Kimura, Hamamatsu, Japan

[73] Assignee: Yamaha Corporation, Hamamatsu, Japan

[21] Appl. No.: 487,425

[22] Filed: Mar. 2, 1990

[30] Foreign Application Priority Data

Mar. 8, 1989 [JP] Japan .................. 1-26393[U]

[51] Int. Cl.⁵ .................. G11B 19/12; H03G 9/00
[52] U.S. Cl. .................. 369/48; 369/54; 369/53; 381/102; 381/108
[58] Field of Search .................. 369/48, 54, 53, 58, 369/19, 49; 381/108, 107, 102; 360/67

[56] References Cited

U.S. PATENT DOCUMENTS

| | | | |
|---|---|---|---|
| 3,604,859 | 9/1971 | Ban | 360/67 |
| 4,406,923 | 9/1983 | Burne, III et al. | 381/108 |
| 4,453,258 | 6/1984 | Richardson | 381/107 |
| 4,553,257 | 11/1985 | Mori et al. | 381/107 |
| 4,558,213 | 12/1985 | Aizawa et al. | 369/48 |
| 4,611,344 | 9/1986 | Hayama et al. | 381/108 |
| 4,926,485 | 5/1990 | Yamashita | 381/107 |
| 4,962,494 | 10/1990 | Kimura | 369/48 |
| 4,964,108 | 10/1990 | Ohtsu et al. | 369/19 |
| 4,982,435 | 1/1991 | Kato et al. | 381/102 |

FOREIGN PATENT DOCUMENTS 45155 12/1989 Japan .

Primary Examiner—Jeffery A. Brier
Assistant Examiner—Khoi Truong
Attorney, Agent, or Firm—Spensley Horn Jubas & Lubitz

[57] ABSTRACT

A loudness control circuit for an audio device used in a reproduction circuit for reproducing a music signal recorded on a recording medium comprises one or plural level detection circuits for detecting levels of signal components of low and high frequency regions of a reproduced signal and control circuits for controlling the levels of the signal components of low and high frequency regions of the reproduced signal in response to outputs of the level detection circuits. The level control is made in accordance with a sound-pressure level for each frequency region of a reproduced signal so that an optimum compensation of the level in response to the sound-pressure level becomes possible.

8 Claims, 4 Drawing Sheets

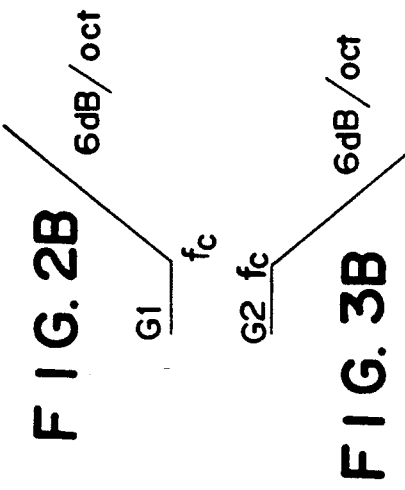
FIG. 2A
FIG. 2B
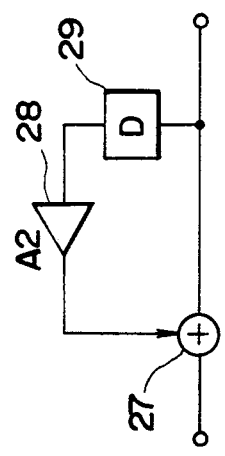
FIG. 3A
FIG. 3B
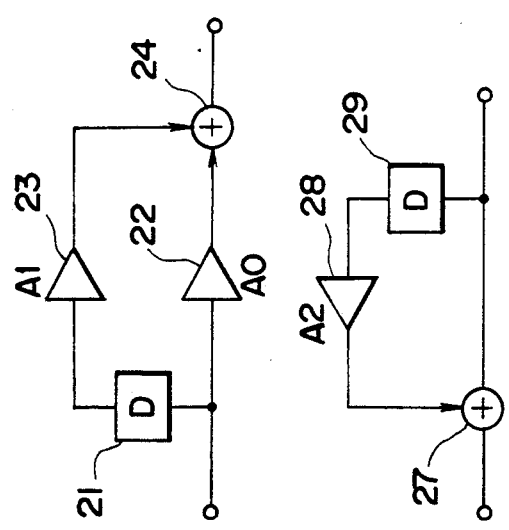
FIG. 4A
FIG. 4B

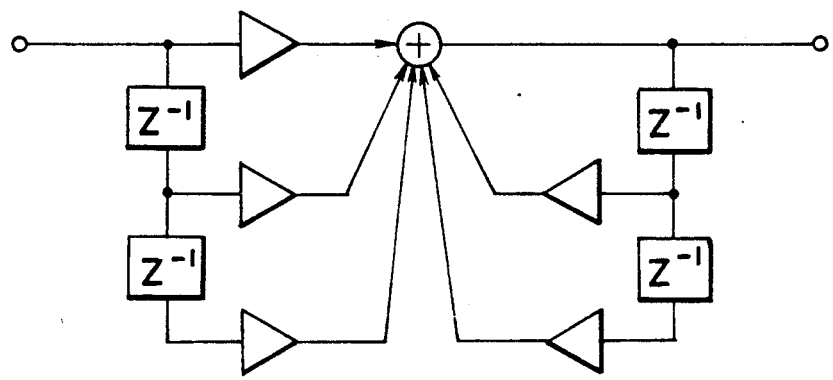
F I G. 5
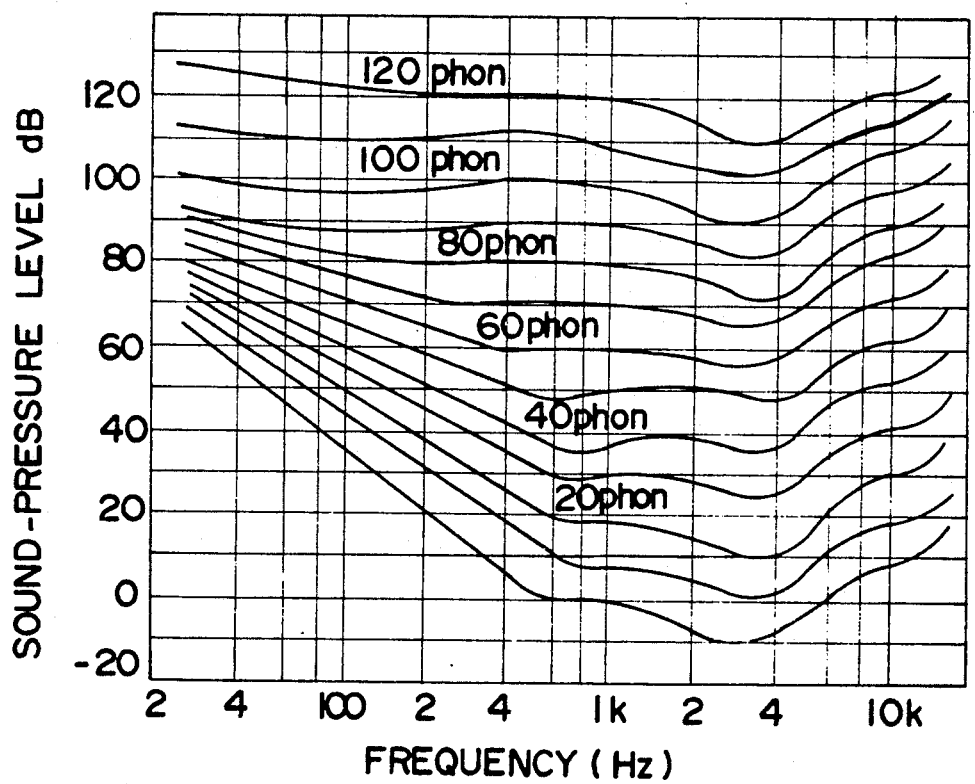
F I G. 6

LOUDNESS CONTROL CIRCUIT FOR AN AUDIO DEVICE

BACKGROUND OF THE INVENTION

This invention relates to a loudness control circuit for an audio device used for compensating for loudness characteristics of the human ear.

As is well known, the human ear has loudness characteristic according to which it becomes harder for a listener to hear bass tones and high tones as a sound volume becomes smaller, even though sound-pressure (strength of sound) of the tone remains the same. For expressing the loudness characteristic specifically, the Fletcher-Munson curves shown in FIG. 6 are known. As will be apparent from these curves, when volume of a sound is relatively large (e.g., 120 phon), sound-pressure levels at which tones of low, middle and high frequencies can be heard at 120 phon are almost the same whereas when volume of a sound is relatively small (e.g., 20 phon), sound-pressure levels at which low frequency and high frequency tones can be heard at 20 phon become larger than that of a middle frequency tone.

This poses a problem in playing back music from audio devices such as a tape recorder and a Compact Disc player. Referring to FIG. 7, curves L1, L2 and L3 show the relationship between sound-pressure and level in auditory sensation with respect to tones of 2 KHz, 10 KHz and 100 Hz. Assume now that a range H1 in the figure represents a range of sound-pressure of a live music (i.e., music at recording time) and a range H2 represents a range of sound-pressure of a reproduced tone. In this case, the difference in auditory sensation (i.e., difference in auditory sensation between a tone of a middle frequency and a tone of a low frequency) is sign A at a sound-pressure level M1 which is a center sound-pressure level of the range of live music but it is enlarged to sign A' when the music is reproduced and, particularly when sound-pressure is small, difference B in auditory sensation is enlarged to B'.

There has been provided in prior art playback devices a circuit for compensating for this difference due to the auditory sensation characteristic, i.e., a loudness control circuit which boosts low frequency and high frequency tones. FIG. 8 shows an example of such a loudness control circuit. In FIG. 8, reference numeral 1 designates an input terminal for inputting the reproduced signal, 2 a variable resistor, 3 an amplifier, 4 a variable resistor, 5 and 6 capacitors, 7 and 8 resistors and 9 an output terminal respectively. A signal from the output terminal 9 is supplied to a loudspeaker (not shown). The variable resistor 2 is provided for controlling tone volume level and the variable resistor 4 is provided for establishing a ratio of boosting low frequency and high frequency tones.

The prior art loudness control circuit has the disadvantage that, since the ratio of boosting low frequency and high frequency tones is constant unless the variable resistor 4 is manipulated, low frequency and high frequency tones tend to be overemphasized when tone volume becomes large.

It is, therefore, an object of the invention to provide a loudness control circuit which is capable of performing an optimum boosting in response to tone volume of a reproduced tone.

SUMMARY OF THE INVENTION

For achieving the above described object of the invention, the loudness control circuit for an audio device according to the invention which is used in a reproduction circuit for reproducing a sound signal recorded on a recording medium comprises level detection means for detecting a level of a signal component of a predetermined frequency region of a reproduced signal, and control means for controlling the level of the signal component of the frequency region of the reproduced signal in response to outputs of the level detection means.

According to the invention, the level control is made in accordance with a sound-pressure level for each frequency region of a reproduced signal. An optimum compensation of the level in response to the sound-pressure level thereby becomes possible so that the problem of excessive boosting occurring when the sound-pressure level is large can be overcome.

A preferred embodiment of the invention will now be described with reference to the accompanying drawings.

BRIEF DESCRIPTION OF THE DRAWINGS

In the accompanying drawings,

FIG. 2A is a block diagram showing an example of a non-circulating type digital filter;

FIG. 2B is a graph showing a gain characteristic of the digital filter shown in FIG. 2A;

FIG. 3A is a block diagram showing an example of a circulating type digital filter;

FIG. 3B is a graph showing a gain characteristic of the digital filter shown in FIG. 3A;

FIG. 4A is a block diagram showing a specific example of the low frequency region boosting circuit 15 and the high frequency region boosting circuit 19;

FIG. 4B is a graph showing a gain characteristic of the circuit shown in FIG. 4A;

FIG. 5 is a block diagram showing a basic circuit of another example of the boosting circuits 15 and 19;

FIG. 6 is a diagram showing the Fletcher-Munson curves;

DESCRIPTION OF A PREFERRED EMBODIMENT

Figure 1:
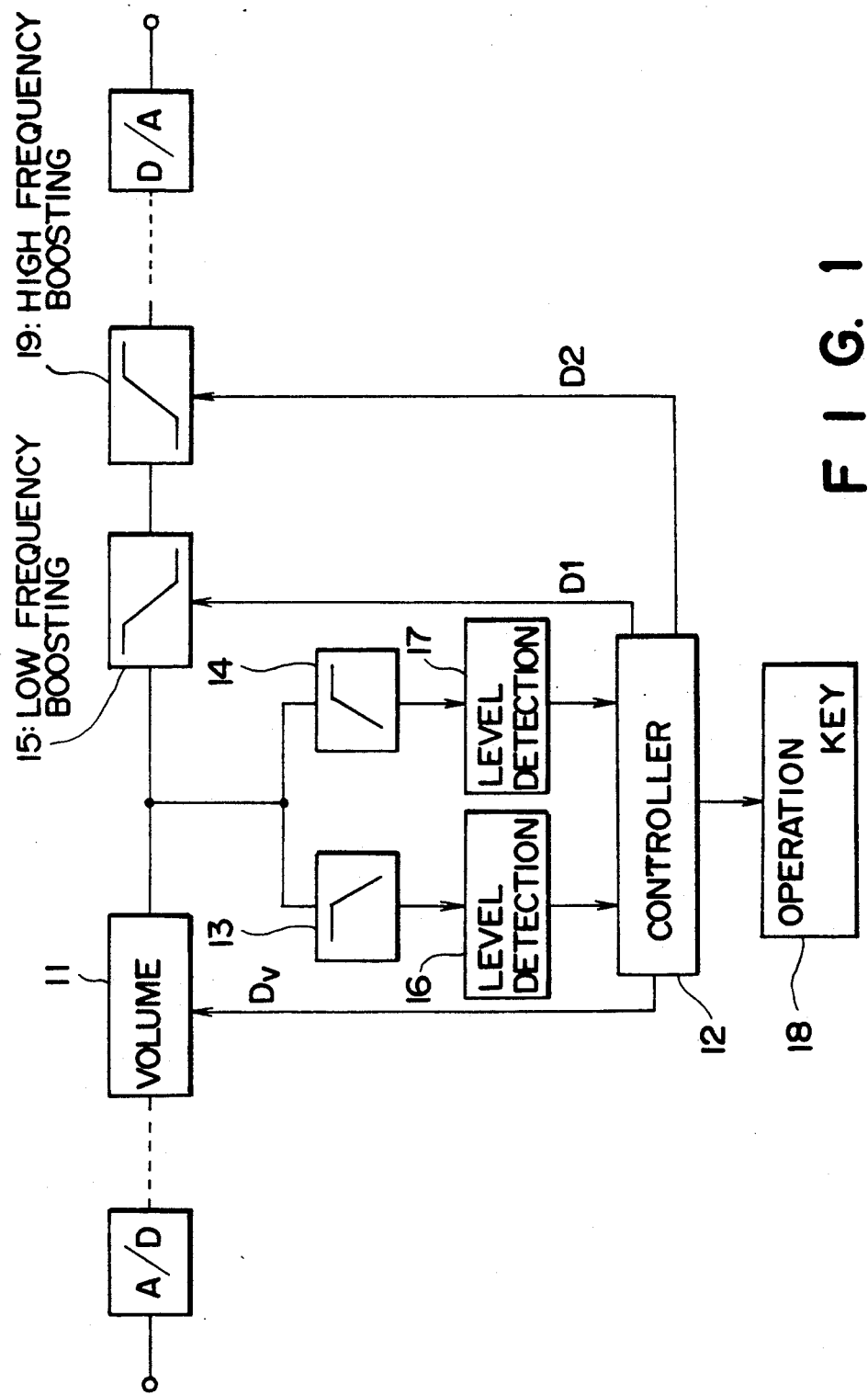
FIG. 1 is a block diagram showing an embodiment of the invention.
Figure 7:
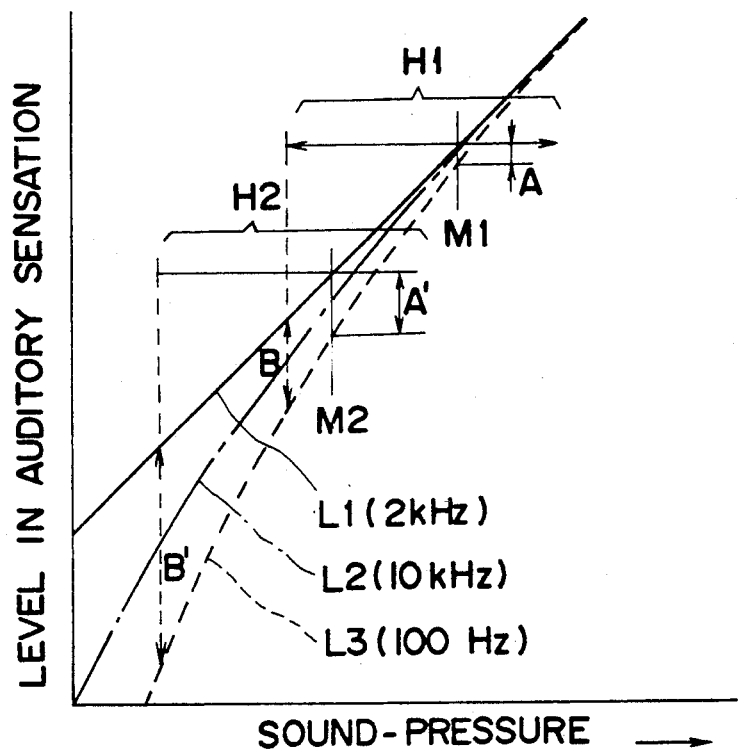
FIG. 7 is a diagram showing the difference in auditory sensation between a live music and a reproduced music.
Figure 8:
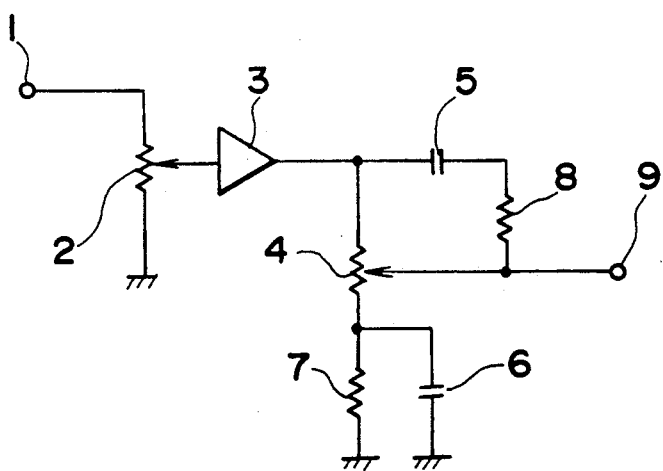
FIG. 8 is a circuit diagram showing an example of the prior art loudness control circuit.

Referring to FIG. 1 which shows an embodiment of the invention, a volume 11 controls digital tone data (a reproduced signal in the form of digital data) applied to an input terminal thereof in response to a control signal Dv supplied from a controller 12. Output data of the volume 11 is supplied to a digital low-pass filter 13, digital high-pass filter 14 and a low frequency region boosting circuit 15. The digital low-pass filter 13 extracts a low frequency component only in the output data of the volume 11 and supplies it to a level detection circuit 16. The level detection circuit 16 computes an average value of the output level of the digital low-pass filter 13 during a certain constant period of time each time the constant period of time has elapsed and supplies this average value to a controller 12. The digital high-pass filter 14 extracts a high frequency component only in the output data of the volume 11 and supplies it to a level detection circuit 17. The level detection circuit 17 computes an average value of the output level of the digital high-pass filter 14 during a certain constant period of time each time the constant period of time has elapsed and supplies it to the controller 12.

The controller 12 supplies the control signal Dv corresponding to a tone volume designated by manipulation of an operation key 18 to the volume 11. The controller 12 supplies also control data D1 corresponding to the output of the level detection circuit 16 to the low frequency region boosting circuit 15 and control data D2 corresponding to the output of the level detection circuit 17 to the high frequency region boosting circuit 19. The low frequency region boosting circuit 15 amplifies the low frequency component only in the output of the volume 11 with an amplification factor corresponding to the control data D1 and thereafter supplies the output data to the high frequency region boosting circuit 19. The high frequency region boosting circuit 19 amplifies the high frequency component only in the output data of the low frequency region boosting circuit 15 with an amplification factor corresponding to the control data D2 and thereafter outputs data for propagation through a loudspeaker (not shown).

As described in the foregoing, in the above described embodiment, the level of the low frequency component of the output (digital reproduced signal) of the volume 11 is detected by the level detection circuit 16 and boosting of the low frequency region is performed with an amplification factor corresponding to the result of the detection. Similarly, the level of the high frequency component of the digital reproduced signal is detected by the level detection circuit 17 and boosting of the high frequency region is performed with an amplification factor corresponding to the result of the detection. Thus, an optimum boosting can be made in accordance with the tone volume level.

Structures of the low frequency region boosting circuit 15 and the high frequency region boosting circuit 19 will be more fully described below.

FIG. 2A shows a structure of a non-circulating type digital filter. In this figure, reference numeral 21 designates a delay circuit for delaying input data by one sampling time, 22 a multiplier for multiplying input data with a coefficient A0, 23 a multiplier for multiplying input data with a coefficient A1, 24 an adder for adding output data of the multipliers 22 and 23 together. FIG. 2B is a graph showing the gain characteristic of the digital filter of FIG. 2A. A gain G1 and a cut-off frequency fc shown in this graph are determined by a sampling frequency is and the coefficients A0 and A1.

FIG. 3A shows a structure of a circulating type digital filter. In this filter, a reference numeral 27 designates an adder, 28 a multiplier for multiplying a coefficient A2 and 29 a delay circuit for delaying input data by one sampling time. FIG. 3B is a graph showing the gain characteristic of the filter shown in FIG. 3A. A gain G2 and a cut-off frequency fc shown in this figure are determined by a sampling frequency fs and the coefficient A2.

The low frequency region boosting circuit 15 and the high frequency region boosting circuit 19 are constructed by combining the above described filters. FIG. 4A shows an example of such circuits. The low frequency region boosting circuit 15 is constructed of a delay circuit 31, multipliers 32 and 33, an adder 34, a multiplier 35 and a delay circuit 36. The high frequency region boosting circuit 19 is constructed of a delay circuit 38, multipliers 39 and 40, an adder 41, a multiplier 42 and a delay circuit 43. FIG. 4B shows the gain characteristic of the low frequency region boosting circuit 15 and the high frequency region boosting circuit 19 shown in FIG. 4A.

In the low frequency region boosting circuit 15 of FIG. 4A, if $$\omega 1 = 2\pi f1 \tag{1}$$
$$f1 = 20 \text{ Hz to } 500 \text{ Hz} \tag{2}$$
$$T = 1/fs \tag{3}$$

where f1 represents the cut-off frequency and fs the sampling frequency,
coefficients a00, a01 and b01 are determined by the following equations:

$$a00 = \frac{\omega 1 T G0 + 2G0}{\omega 1 T + 2G0} \tag{4}$$

$$a01 = \frac{\omega 1 T G0 - 2G0}{\omega 1 T + 2G0} \tag{5}$$

$$b01 = \frac{\omega 1 T - 2G0}{\omega 1 T + 2G0} \tag{6}$$

Similary, in the high frequency region boosting circuit 19, if $$\omega 2 = 2\pi f2 \tag{7}$$

$$f2 = 4 \text{ Hz to } 20 \text{ KHz} \tag{8}$$

where f2 represents the cut-off frequency,
coefficients a10, a11 and b11 are determined by the following equations:

$$a10 = \frac{\omega 2 T G1 + 2G1}{\omega 2 T G1 + 2} \tag{9}$$

$$a11 = \frac{\omega 2 T G1 - 2G1}{\omega 2 T G1 + 2} \tag{10}$$

$$b11 = \frac{\omega 2 T G1 - 2}{\omega 2 T G1 + 2} \tag{11}$$

These coefficients are stored in a memory in the controller 12 in correspondence to output values of the level detection circuits 16 and 17. Each time the outputs of the level detection circuits 16 and 17 change, corresponding coefficients are read out and supplied to the low frequency region boosting circuit 15 and the high frequency region boosting circuit 19.

In the above described embodiment, the boosting circuits are both made of a two stage serial circuit of primary filters but similar characteristics can be realized with the secondary filter shown in FIG. 5.

In the above described embodiment, the boosting characteristics are controlled in response to the output level of the volume 11. Alternatively, sound-pressure level of a tone reproduced by a loudspeaker or the like may be detected by a microphone or the like and the boosting characteristics may be controlled in response to this detected value. According to this structure, a control taking characteristics of the loudspeaker into account can be achieved.

The above described embodiment is a loudness control circuit processing a digital signal. The invention however is applicable also to a circuit processing an analog signal.

What is claimed is:

1. A loudness control circuit for an audio device used in a reproduction circuit for reproducing a sound signal recorded on a recording medium comprising:

level detection means for detecting a level of a signal component, in a plurality of predetermined frequency regions, of a reproduced signal, the level detection means including filter means for passing a frequency component of at least one of the plurality of predetermined frequency regions and a level detection circuit connected to the filter means for computing an average value of an output level of the filter means during a predetermined period of time; and control means for controlling the level of said signal component of said reproduced signal in response to outputs of said level detection means, wherein the level detection circuit supplies the average value to the control means each time the constant period of time has elapsed.

2. A loudness control circuit as defined in claim 1 wherein said control means comprises a controller for outputting control data corresponding to the output of said level detection means and a level boosting circuit for said frequency region for amplifying the level of said signal component of the frequency region with an amplification factor corresponding to said control data provided by said controller.

3. A loudness control circuit as defined in claim 1 wherein the level boosting circuit comprises a digital filter with a gain and a cut-off frequency of said digital filter being determined by a sampling frequency and a coefficient corresponding to the output values of said level detection means, and said controller includes memory means for storing coefficients corresponding to the output values of said level detection means, wherein the controller reads the coefficients corresponding to the output values of said level detection means and supplies the coefficients to the digital filter.

4. A loudness control circuit as defined in claim 1, wherein said level detection means extracts the reproduced signal from a signal path of the reproduced signal prior to the reproduced signal reaching the level boosting circuit.

5. A loudness control circuit as defined in claim 1 wherein said level detection means extracts the reproduced signal from an acoustic output of a loudspeaker which is driven for acoustically outputting the reproduced signal.

6. A loudness control circuit as defined in claim 1 wherein said reproduced signal is a digital signal and is subjected to digital signal processing.

7. A loudness control circuit as defined in claim 1 wherein said reproduced signal is an analog signal and is subjected to analog signal processing.

8. A loudness control circuit as defined in claim 1 wherein said control means controls the level of said signal component in accordance with auditory sensation curve data.

* * * * *